United States Patent
Lv et al.

(10) Patent No.: US 10,916,166 B2
(45) Date of Patent: Feb. 9, 2021

(54) SHIFT REGISTER UNIT, SHIFT REGISTER CIRCUITRY AND DISPLAY DEVICE

(71) Applicants: BOE Technology Group Co., Ltd., Beijing (CN); Hefei BOE Optoelectronics Technology Co., Ltd., Anhui (CN)

(72) Inventors: Lei Lv, Beijing (CN); Jie Gao, Beijing (CN); Chunmin Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 118 days.

(21) Appl. No.: 16/136,835

(22) Filed: Sep. 20, 2018

(65) Prior Publication Data
US 2019/0096308 A1   Mar. 28, 2019

(30) Foreign Application Priority Data

Sep. 25, 2017 (CN) .......................... 2017 1 0873646

(51) Int. Cl.
| | |
|---|---|
| G11C 19/00 | (2006.01) |
| G09G 3/20 | (2006.01) |
| G11C 19/28 | (2006.01) |
| G09G 3/36 | (2006.01) |

(52) U.S. Cl.
CPC ............. *G09G 3/20* (2013.01); *G09G 3/3677* (2013.01); *G11C 19/28* (2013.01); *G11C 19/287* (2013.01); *G09G 2300/0809* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 8,811,567 B2* | 8/2014 | Wu ........................ | G11C 19/28 377/64 |
| 2007/0104307 A1* | 5/2007 | Kim ........................ | G11C 19/28 377/64 |
| 2009/0167668 A1* | 7/2009 | Kim ..................... | G09G 3/3677 345/100 |
| 2011/0002438 A1* | 1/2011 | Kim ........................ | G11C 19/28 377/67 |

(Continued)

*Primary Examiner* — Tuan T Lam
(74) *Attorney, Agent, or Firm* — Westman, Champlin & Koehler, P.A.

(57) ABSTRACT

The present disclosure provides a shift register unit, which comprises: a pull-down node control circuit, connected to a control node and a pull-down node, and configured to control a change in a potential of the pull-down node according to a potential of the control node, where the potential of the control node and the potential of the pull-down node are inversed in phase; and a first potential regulating circuit, connected to an upper-stage pull-up node and the control node, and configured to: transmit a potential of the upper-stage pull-up node to the control node when the potential of the upper-stage pull-up node is an effective operating potential; and disconnect a connection between the control node and the upper-stage pull-up node when the potential of the upper-stage pull-up node is not an effective operating potential.

17 Claims, 3 Drawing Sheets

(56) References Cited

U.S. PATENT DOCUMENTS

| | | | |
|---|---|---|---|
| 2011/0273417 A1* | 11/2011 | Shin | G09G 3/20 |
| | | | 345/211 |
| 2011/0286572 A1* | 11/2011 | Shang | G11C 19/28 |
| | | | 377/67 |
| 2018/0108290 A1* | 4/2018 | Chen | G11C 19/28 |
| 2018/0197448 A1* | 7/2018 | Zhang | G11C 7/02 |
| 2018/0342187 A1* | 11/2018 | Shan | G09G 3/20 |
| 2019/0206503 A1* | 7/2019 | Zhang | G09G 3/20 |
| 2019/0340991 A1* | 11/2019 | Hwang | G09G 3/3696 |

* cited by examiner

SHIFT REGISTER UNIT, SHIFT REGISTER CIRCUITRY AND DISPLAY DEVICE

CROSS-REFERENCE TO RELATED APPLICATION

This application claims a priority to Chinese Patent Application No. 2017/10873646.4 filed on Sep. 25, 2017, the disclosure of which is incorporated in its entirety by reference herein.

TECHNICAL FIELD

The present disclosure relates to the field of display driving technologies, and in particular to a shift register unit, a shift register circuitry and a display device.

BACKGROUND

A liquid crystal display panel uses a progressive scanned mode to display a picture. A driver of the liquid crystal display panel mainly includes a gate driver and a data driver. The gate driver controls gate electrodes to be turned on row by row through a clock signal, and the data driver charges pixels through a thin film transistor (TFT), for realizing the picture display.

A shift register is commonly used in the gate driver of the liquid crystal display panel, and each gate line of the liquid crystal display panel is connected to one stage of circuit unit of the shift register. Each pixel is scanned progressively through a gate electrode input signal outputted from a gate drive circuit. In a shift register unit in the related art, there is a leakage path during charging a pull-up node, and a gate electrode of a first pull-down transistor included in a first pull-down circuit is connected to a pull-down node. A first stage of the first pull-down transistor is connected to the pull-up node, and a second stage of the first pull-down transistor is connected to a low-level input terminal. During charging the pull-up node, the electric leakage of the first pull-down transistor may cause that a potential of the pull node cannot reach a full turn-on voltage of the output transistor, thereby causing that the outputted gate drive signal rises and falls slowly, and the gate drive signal is distorted.

SUMMARY

In a first aspect, the present disclosure provides a shift register unit, applied to a shift register circuitry. The shift register unit includes:

a pull-down node control circuit, connected to a control node and a pull-down node, and configured to control a change in a potential of the pull-down node according to a potential of the control node, where the potential of the control node and the potential of the pull-down node are inversed in phase; and a first potential regulating circuit, connected to an upper-stage pull-up node and the control node, and configured to: transmit a potential of the upper-stage pull-up node to the control node when the potential of the upper-stage pull-up node is an effective operating potential; and disconnect a connection between the control node and the upper-stage pull-up node when the potential of the upper-stage pull-up node is not an effective operating potential;

where the upper-stage pull-up node is a pull-up node in an upper-stage shift register unit adjacent to the shift register unit in the shift register circuitry, and an upper-stage pull-down node is a pull-down node in an upper-stage shift register unit adjacent to the shift register unit in the shift register circuitry.

In some optional embodiments, the shift register unit further includes a second potential regulating circuit, connected between the pull-up node and the control node. The second potential regulating circuit is configured to enable the control node to be connected to the pull-up node when a potential of the upper-stage pull-down node is an effective operating potential, and disconnect a connection between the control node and the pull-up node when the potential of the upper-stage pull-down node is not an effective operating potential.

In some optional embodiments, the first potential regulating circuit includes a first potential regulating transistor, both a gate electrode and a first electrode of the first potential regulating transistor are connected to the upper-stage pull-up node, and a second electrode of the first potential regulating transistor is connected to the control node.

In some optional embodiments, the second potential regulating circuit includes a second potential regulating transistor. A gate electrode of the second potential regulating transistor is connected to the upper-stage pull-down node, a first electrode of the second potential regulating transistor is connected to the pull-up node, and a second electrode of the second potential regulating transistor is connected to the control node.

In some optional embodiments, a potential change of the upper-stage pull-down node is in a complementary relation with a potential change of the upper-stage pull-up node, and the first potential regulating transistor and the second potential regulating transistor are turned on alternatively, such that the control node is at an effective operating potential during an initial phase, an input phase, and an output phase of each display period of the shift register unit.

In some optional embodiments, the shift register unit of the present disclosure further includes an output noise reduction circuit, connected to the upper-stage pull-up node, a gate drive signal output terminal, and a first level input terminal. The output noise reduction circuit is configured to: enable the gate drive signal output terminal to be connected to the first level input terminal when a potential of the upper-stage pull-up node is an effective operating potential; and disconnect a connection between the gate drive signal output terminal and the first level input terminal when the potential of the upper-stage pull-up node is not an effective operating potential.

In some optional embodiments, the output noise reduction circuit includes an output noise reduction transistor. A gate electrode of the output noise reduction transistor is connected to the upper-stage pull-up node, a first electrode of the output noise reduction transistor is connected to the gate drive signal output terminal, and a second electrode of the output noise reduction transistor is connected to the first level input terminal. The output noise reduction transistor is configured to perform denoising on the gate drive signal output terminal.

In some optional embodiments, the pull-down node control circuit includes:

a first pull-down node control transistor, where both a gate electrode and a first electrode of the first pull-down node control transistor are connected to a second level input terminal;

a second pull-down node control transistor, where a gate electrode of the second pull-down node control transistor is connected to the control node, and a first electrode of the second pull-down node control transistor is connected to a second electrode of the first pull-down node control transistor;

a third pull-down node control transistor, where a gate electrode of the third pull-down node control transistor is connected to the second electrode of the first pull-down node control transistor, a first electrode of the third pull-down node control transistor is connected to the second level input terminal, and a second electrode of the third pull-down node control transistor is connected to the pull-down node; and a fourth pull-down node control transistor, where a gate electrode of the fourth pull-down node control transistor is connected to the control node, a first electrode of the fourth pull-down node control transistor is connected to the pull-down node, and a second electrode of the fourth pull-down node control transistor is connected to the first level input terminal, where a width-to-length ratio of the second pull-down node control transistor is greater than a width-to-length ratio of the first pull-down node control transistor, and a width-to-length ratio of the fourth pull-down node control transistor is greater than a width-to-length ratio of the third pull-down node control transistor, where when each transistor is an n-type transistor, the effective operating potential is a high level, the first level input terminal inputs a low level, and the second level input terminal inputs a high level; and when each transistor is a p-type transistor, the effective operating potential is a low level, the first level input terminal inputs a high level, and the second level input terminal inputs a low level.

In some optional embodiments, the shift register unit of the present disclosure further includes:

a first pull-down circuit, connected to the pull-up node, the pull-down node and a first level input terminal, where the first pull-down circuit is configured to control the pull-up node and the first level input terminal to be connected or disconnected according to the potential of the pull-down node; and an output circuit, connected to the pull-up node, a clock signal input terminal and a gate drive signal output terminal, where the output circuit is configured to control the gate drive signal output terminal and the clock signal input terminal to be connected or disconnected according to a potential of the pull-up node.

In some optional embodiments, the first pull-down circuit includes a first pull-down transistor, a gate electrode of the first pull-down transistor is connected to the pull-down node, a first electrode of the first pull-down transistor is connected to the pull-up node, and a second electrode of the first pull-down transistor is connected to the first level input terminal. The output circuit includes:

an output transistor, where a gate electrode of the output transistor is connected to the pull-up node, a first electrode of the output transistor is connected to the gate drive signal output terminal, and a second electrode of the output transistor is connected to the first level input terminal; and a storage capacitor, where a first end of the storage capacitor is connected to the pull-up node, and a second end of the storage capacitor is connected to the gate drive signal output terminal.

In some optional embodiments, each transistor of the shift register unit is an n-type transistor, and each display period of the shift register unit includes an initial phase, an input phase, an output phase and a reset phase. At the initial phase, the potential of the upper-stage pull-up node is a high level, the first potential regulating transistor is turned on and transmits the high level of the upper-stage pull-up node to the control node, such that the potential of the control node is a high level; the potential of the upper-stage pull-down node is a low level, and the second potential regulating transistor is turned off, such that a connection between the control node and the pull-up node is disconnected, the fourth pull-down node control transistor and the second pull-down node control transistor are turned on under the action of the high level of the control node; the potential of the pull-down node is a low level, and the first pull-down transistor is turned off to prohibit the pull-up node from discharging to the first level input terminal through the first pull-down transistor.

In some optional embodiments, at the input phase, the pull-up node is rapidly charged to a second level through a high level inputted by an input circuit, the potential of the upper-stage pull-up node is a high level, the potential of the upper-stage pull-down node is a low level, and the first pull-down transistor is turned off to prohibit the pull-up node from discharging to the first level inputted through the first pull-down transistor.

In some optional embodiments, at the output phase, the clock signal input terminal inputs a high level, and a storage capacitor is charged to pull up the potential of the pull-up node to be twice of the second level. In a second aspect, the present disclosure further provides a shift register circuitry including a plurality of the above cascaded shift registers. Excepting a first stage of shift register unit, a first potential regulating circuit included in each stage of the shift register units is connected to an upper-stage pull-up node, and a second potential regulating circuit included in each stage of the shift register units is connected to an upper-stage pull-down node.

In some optional embodiments, a first potential regulating circuit of the first stage of shift register unit is connected to an initial pull-up terminal, and a second potential regulating circuit of the first stage of shift register unit is connected to an initial pull-down terminal.

In some optional embodiments, each stage of the shift register units includes an input terminal, a reset terminal and a gate drive signal output terminal. Excepting the first stage of shift register unit, an input terminal of each stage of the shift register units is connected to a gate drive signal output terminal of an upper-stage shift register unit adjacent to the shift register unit; and excepting the last stage of shift register unit, a reset terminal of each stage of the shift register units is connected to a gate drive signal output terminal of a next stage of shift register unit adjacent to the shift register unit.

In some optional embodiments, an input terminal of the first stage of shift register unit is connected to an initial signal input terminal, and a reset terminal of the last stage of shift register unit is connected to a reset signal input terminal.

In a third aspect, the present disclosure further provides a display device including the shift register circuitry described above.

BRIEF DESCRIPTION OF THE DRAWINGS

In order to more make the technical solutions in the embodiments of the present disclosure or the related art, drawings need to be used in the embodiments or the related art description will be briefly described below. Obviously, the drawings in the following description are merely some embodiments of the present disclosure, and other drawings can be obtained for those skilled in the art from these drawings without any creative labor.

DETAILED DESCRIPTION

The present disclosure will be described hereinafter in a clear and complete manner in conjunction with the drawings and embodiments. Obviously, the following embodiments are merely a part of, rather than all of, the embodiments of the present disclosure. All other embodiments obtained by persons of ordinary skill in the art based on the embodiments of the present disclosure without making inventive efforts fall in the protective scope of the present disclosure.

Each of the transistors used in all embodiments of the present disclosure may be a thin film transistor or a field effect transistor or other device of same characteristics with the foregoing. In the embodiments of the present disclosure, in order to distinguish the two electrodes of the transistor except a gate electrode, one of the two electrodes is referred to as a first electrode, and the other electrode is referred to as a second electrode. In an actual operation, the first electrode may be a drain electrode, and the second electrode may be a source electrode; or the first electrode may be a source electrode, and the second electrode may be a drain electrode.

In the related art, a leakage path of a pull-up node enables that the pull-up node discharges to a first level input terminal through a first pull-down transistor, that is, electric leakage occurs due to the first pull-down transistor during charging of the pull-up node, causing that a potential of the pull node cannot reach a full turn-on voltage of an output transistor, and distortion problems occur when a gate drive signal rises or falls. However, in the embodiments of the present disclosure, for addressing the electric leakage due to the first pull-down transistor during charging of the pull-up node, through improving a circuit and its timing, the first pull-down transistor is turned off before the pull-up node is charged, thereby avoiding electric leakage of the pull-up node.

Figure 1:
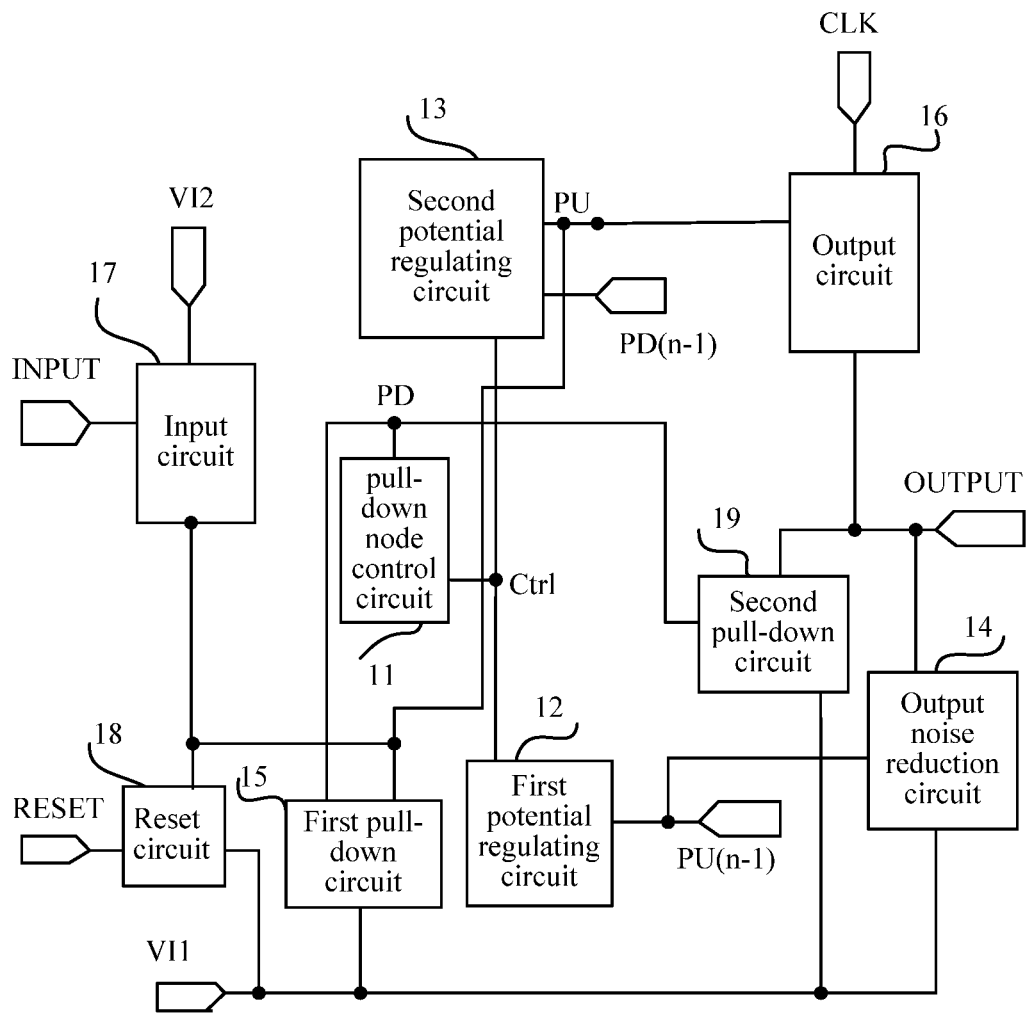
FIG. 1 is a schematic structural diagram of a shift register unit according to an embodiment of the present disclosure.

As shown in FIG. 1, a shift register unit according to the embodiment of the present disclosure includes a pull-down node control circuit 11, a first potential regulating circuit 12, a second potential regulating circuit 13, an output noise reduction circuit 14, and a first pull-down circuit 15, an output circuit 16, an input circuit 17, a reset circuit 18, and a second pull-down circuit 19.

The pull-down node control circuit 11 is connected to a pull-down node PD, and the pull-down node control circuit 11 has a control node Ctrl, and the pull-down node control circuit 11 is configured to control a change in a potential of the pull-down node PD according to a potential of the control node Ctrl, where the potential of the control node Ctrl and the potential of the pull-down node PD are inversed in phase.

The first potential regulating circuit 12 is connected to an upper-stage pull-up node PU(n−1) and the control node Ctrl, and is configured to: transmit a potential of the upper-stage pull-up node PU(n−1) to the control node Ctrl when the potential of the upper-stage pull-up node PU(n−1) is an effective operating potential; and disconnect a connection between the control node Ctrl and the upper-stage pull-up node PU(n−1) when the potential of the upper-stage pull-up node PU(n−1) is not an effective operating potential.

The second potential regulating circuit 13 is connected between a pull-up node PU and the control node Ctrl, and the second potential regulating circuit 13 is connected to an upper-stage pull-down node PD(n−1), the second potential regulating circuit 13 is configured to conduct the control node Ctrl and the pull-up node PU when a potential of the upper-stage pull-down node PD(n−1) is an effective operating potential, and disconnect a connection between the control node Ctrl and the pull-up node PU when the potential of the node PD(n−1) is not an effective operating potential.

Specifically, the upper-stage pull-up node PU(n−1) is a pull-up node in an upper-stage shift register unit adjacent to the shift register unit in a shift register circuitry, and the upper-stage pull-down node PD(n−1) is a pull-down node in an upper-stage shift register unit adjacent to the shift register unit in the shift register circuitry.

The output noise reduction circuit 14 is connected to the upper-stage pull-up node PU(n−1), a gate drive signal output terminal OUTPUT, and a first level input terminal VI1, and is configured to: control the gate drive signal output terminal OUTPUT and the first level input terminal VI1 to be connected when a potential of the upper-stage pull-up node PU(n−1) is an effective operating potential; and disconnect a connection between the gate drive signal output terminal OUTPUT and the first level input terminal VI1 when the potential of the upper-stage pull-up node PU(n−1) is not an effective operating potential.

In an actual operation, the first level input terminal VI1 may be a low level input terminal for inputting a low level VGL.

The first pull-down circuit 15 is connected to the pull-up node PU, the pull-down node PD, and the first level input terminal VI1, and is configured to control the pull-up node PU and the first level input terminal VI1 to be connected or disconnected according to the potential of the pull-down node PD.

The output circuit 16 is connected to the pull-up node PU, a clock signal input terminal CLK and the gate drive signal output terminal OUTPUT, and is configured to control the gate drive signal output terminal OUTPUT and the clock signal input terminal CLK to be connected or disconnected according to the potential of the pull-up node PU.

The input circuit 17 is connected to an input terminal INPUT, a second level input terminal VI2 and the pull-up node PU. The input circuit 17 is configured to control the pull-up node PU and the second level input terminal VI2 to be connected or disconnected under the control of the input terminal INPUT. The second level input terminal VI2 may be a high level input terminal for inputting a high level VGH. In an actual operation, the input terminal INPUT can be a gate drive signal input terminal OUTPUT (n−1) in an upper-stage shift register unit adjacent to the shift register unit.

The reset circuit 18 is connected to a reset terminal RESET, the first level input terminal VI1 and the pull-up node PU. The reset circuit 18 is configured to control the pull-up node PU and the first level input terminal VI1 to be connected or disconnected under the control of the reset terminal RESET. In an actual operation, the reset terminal RESET may be a gate drive signal input terminal OUTPUT (n+1) in an upper-stage shift register unit adjacent to the shift register unit.

The second pull-down circuit 19 is connected to the pull-down node PD, the gate driving signal output terminal OUTPUT and the first level input terminal VI1. The second pull-down circuit 19 is configured to control the gate driving signal output terminal OUTPUT and the first level input terminal VI1 to be connected or disconnected under the control of the pull-down node PD.

In an actual operation, the effective operating potential is a potential that enables a corresponding transistor to be turned on. For example, if the transistor is an n-type transistor, the effective operating potential is a high potential; and if the transistor is a p-type transistor, the effective operating potential is a low potential.

Figure 2:
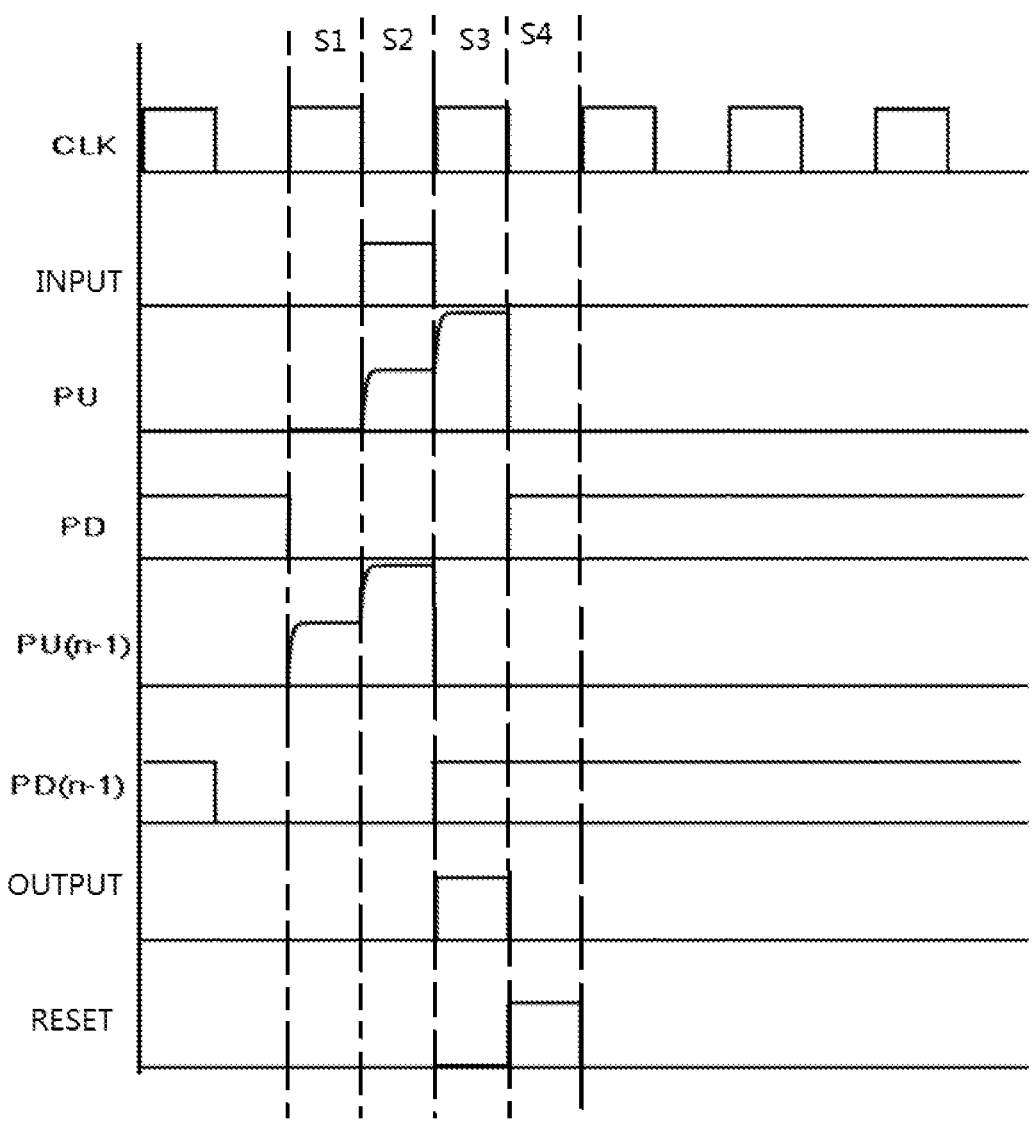
FIG. 2 is an operation timing diagram of a shift register unit according to an embodiment of the present disclosure.

In the embodiment as shown in FIG. 1, each of the transistors included in each circuit is an n-type transistor, and the effective operating potential is high potential. Alternatively, each of the transistors may be designed as a p-type transistor, or a part of the transistors in the shift register circuitry may be an n-type transistor and the other part may be a p-type transistor, which is not limited in the present disclosure. As shown in FIG. 2, an operation timing diagram of a shift register unit according to an embodiment of the present disclosure is shown. Each display period of the shift register unit during operation includes an initial phase S1, an input phase S2, an output phase S3, and a reset phase S4.

At the initial stage S1, a potential of an upper-stage pull-up node PU(n−1) is a high level, and a potential of a upper-stage pull-down node PD(n−1) is a low level, and a first potential regulating circuit 12 controls to transmit the potential of the upper-stage pull-up node PU(n−1) to a control node Ctrl such that a potential of the control node Ctrl is a high level, and the second potential regulating circuit 13 controls to disconnect a connection between the control node Ctrl and the pull-up node PU, and the pull-down node control circuit 11 controls a potential of the control node Ctrl and a potential of the pull-down node PD to be inversed in phase, thereby controlling the potential of the pull-down node PD to be a low level, and controlling a leakage path of the PU to be turned off. At the initial stage S1, the potential of the PU is a low level; the output noise reduction circuit 14 controls the gate drive signal output terminal OUTPUT and the first level input terminal to be connected, and enables an output of the OUTPUT to be a low level, and performs noise release on the gate drive signal output terminal OUTPUT.

At the input stage S2, the CLK inputs a low level, a potential of an upper-stage pull-up node PU(n−1) is a high level, a potential of a upper-stage pull-down node PD(n−1) is a low level, the input terminal INPUT inputs a high level, the potential of the PU is pulled to be a high level, and the first potential regulating circuit 12 transmits the potential of the upper-stage pull-up node PU(n−1) to a control node Ctrl such that a potential of the control node Ctrl is a high level, and the second potential regulating circuit 13 controls the control node Ctrl and the pull-up node PU to be disconnected, and the pull-down node control circuit 11 controls a potential of the control node Ctrl and a potential of the pull-down node PD to be inversed in phase, thereby controlling the potential of the pull-down node PD to be a low level, and controlling a leakage path of the PU to be turned off, enabling a connection between the gate drive signal output terminal OUTPUT and the first level input terminal. The output noise reduction circuit enables a connection between the gate drive signal output terminal OUTPUT and the first level input terminal, and enables an output of the OUTPUT to be a low level, and performs noise release on the gate drive signal output terminal OUTPUT.

At the output stage S3, the CLK inputs a high level, the potential of the pull-up node PU is a high level, and the potential of the upper-stage pull-up node PU(n−1) is a low level, and the potential of the upper-stage pull-down node PD(n−1) is a high level. The first potential regulating circuit 12 disconnects a connection between the control node Ctrl and the upper-stage pull-up node PU(n−1), and the second potential regulating circuit 13 controls the control node Ctrl and the pull-up node PU to be connected such that the potential of the control node Ctrl is a high level. The pull-down node control circuit 11 controls a potential of the control node Ctrl and a potential of the pull-down node PD to be inversed in phase, thereby controlling the potential of the pull-down node PD to be a low level, and controlling the leakage path of the PU to be turned off; and enabling the potential of the PU reaches a potential at which an output transistor is fully turned on, to control the output transistor to be fully turned on. In this case, the output noise reduction circuit 14 controls the gate drive signal output terminal OUTPUT and the first level input terminal to be disconnected. Therefore, at the output phase S3, the potential of the PU is a high level, and the OUTPUT outputs the high level of CLK.

At the reset stage S4, the potential of the pull-up node PU is a low level, the potential of the upper-stage pull-up node PU(n−1) is a low level, and the potential of the upper-stage pull-down node PD(n−1) is a high level. The first potential regulating circuit 12 controls to disconnect a connection between the control node Ctrl and the upper-stage pull-up node PU(n−1), the second potential regulating circuit 13 controls the control node Ctrl and the pull-up node PU to be connected such that the potential of the control node Ctrl is a low level. The pull-down node control circuit 11 controls a potential of the control node Ctrl and a potential of the pull-down node PD to be inversed in phase, thereby controlling the potential of the pull-down node PD to be a high level. The output noise reduction circuit 14 controls to disconnect a connection between the gate drive signal output terminal OUTPUT and the first level input terminal.

Figure 3:
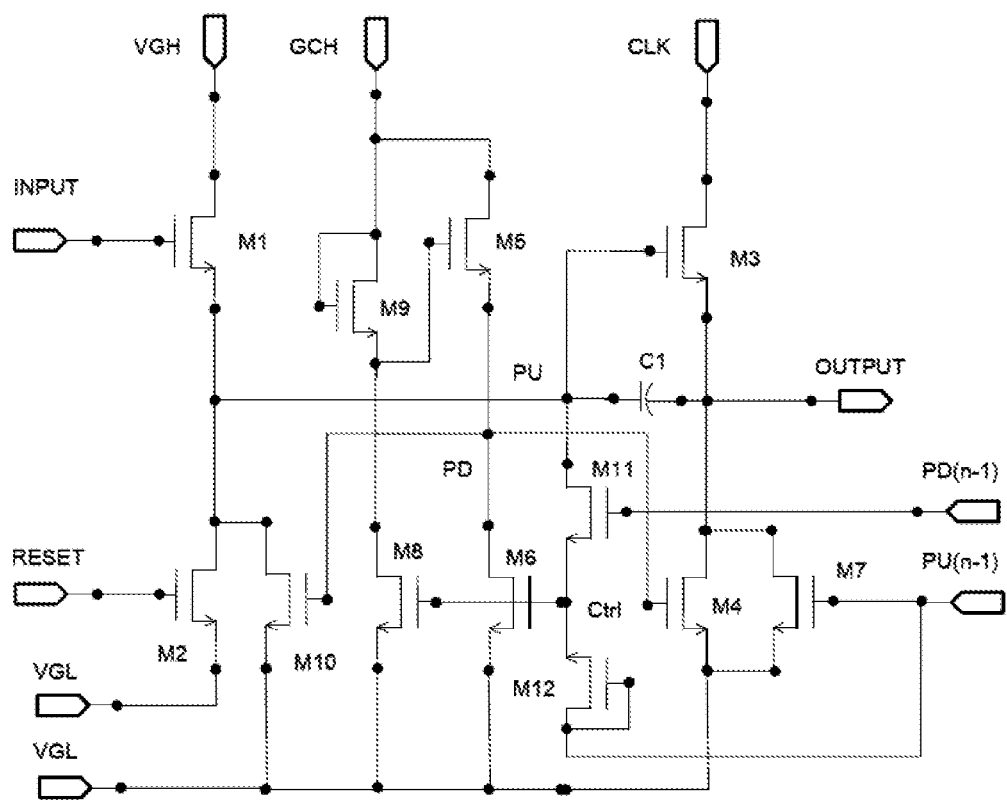
FIG. 3 is a circuit diagram of a shift register unit according to an embodiment of the present disclosure.

The shift register unit of the present disclosure will be described hereinafter by means of a specific embodiment. As shown in FIG. 3, based on the embodiment of the shift register unit as shown in FIG. 1, the pull-down node control circuit 11 includes:

a first pull-down node control transistor M9, both a gate electrode and a drain electrode of which are connected to a high voltage input terminal for inputting a high voltage GCH;

a second pull-down node control transistor M8, where a gate electrode of the second pull-down node control transistor is connected to the control node Ctrl, and a drain electrode of the second pull-down node control transistor is connected to a source electrode of the first pull-down node control transistor M9;

a third pull-down node control transistor M5, where a gate electrode of the third pull-down node control transistor is connected to the source electrode of the first pull-down node control transistor M9, a drain electrode of the third pull-down node control transistor is connected to the high voltage input terminal for inputting a high voltage GCH, and a source electrode of the third pull-down node control transistor is connected to the pull-down node PD; and a fourth pull-down node control transistor M6, where a gate electrode of the fourth pull-down node control transistor is connected to the control node Ctrl, a drain electrode of the fourth pull-down node control transistor is connected to the pull-down node PD, and a source electrode of the fourth pull-down node control transistor is connected to a low-level input terminal for inputting a low level VGL;

where a width-to-length ratio of the second pull-down node control transistor M8 is greater than a width-to-length ratio of the first pull-down node control transistor M9, and a width-to-length ratio of the fourth pull-down node control transistor M6 is greater than a width-to-length ratio of the third pull-down node control transistor M5.

The first potential regulating circuit 12 includes a first potential regulating transistor M12, both a gate electrode and a drain electrode of the first potential regulating transistor are connected to the upper-stage pull-up node PU (n−1), and a source electrode of the first potential regulating transistor is connected to the control node Ctrl.

The second potential regulating circuit 13 includes a second potential regulating transistor M11, a gate electrode of the second potential regulating transistor is connected to the upper-stage pull-down node PD (n−1), a drain electrode of the second potential regulating transistor is connected to the pull-up node, and a source electrode of the second potential regulating transistor is connected to the control node Ctrl.

The output noise reduction circuit 14 includes an output noise reduction transistor M7, a gate electrode of the output noise reduction transistor is connected to the upper-stage pull-up node PU (n−1), a drain electrode of the output noise reduction transistor is connected to the gate drive signal output terminal OUTPUT, and a source electrode of the output noise reduction transistor is connected to the low level input terminal for inputting a low level VGL.

The first pull-down circuit 15 includes a first pull-down transistor M10, a gate electrode of the first pull-down transistor is connected to the pull-down node PD, a drain electrode of the first pull-down transistor is connected to the pull-up node PU, and a source electrode of the first pull-down transistor is connected to the low level input terminal for inputting a low level VGL.

The output circuit 16 includes an output transistor M3 and a storage capacitor C1. A gate electrode of the output transistor is connected to the pull-up node PU, a drain electrode of the output transistor is connected to the gate drive signal output terminal OUTPUT, and a source electrode of the output transistor is connected to the low level input terminal for inputting a low level VGL. A first end of the storage capacitor is connected to the pull-up node PU, and a second end of the storage capacitor is connected to the gate drive signal output terminal OUTPUT.

The input circuit 17 includes an input transistor M1, a gate electrode of the input transistor is connected to the input terminal INTPUT, a drain electrode of the input transistor is connected to the high level input terminal for inputting a high level VGH, and a source electrode of the input transistor is connected to the pull-up node PU.

The reset circuit 18 includes a reset transistor M2, a gate electrode of the reset transistor is connected to the reset terminal RESET, a drain electrode of the reset transistor is connected to the pull-up node PU, and a source electrode of the reset transistor is connected to the low-level input terminal for inputting a low level VGL.

The second pull-down circuit 19 includes a second pull-down transistor M4, a gate electrode of the second pull-down transistor is connected to the pull-down node PD, a drain electrode of the second pull-down transistor is connected to the gate drive signal output terminal OUTPUT, and a source electrode of the second pull-down transistor is connected to the low level input terminal for inputting a low level VGL.

In the embodiment shown in FIG. 3, all of the transistors are n-type transistors. Optionally, in an actual operation, the above transistors may also be p-type transistors, which can be achieved only through altering a control voltage accordingly. Therefore, the types of the transistors are not limited herein.

When the shift register unit as shown in FIG. 3 is in operation, a potential change of the PD(n−1) and a potential change of the PU(n−1) are in a complementary relationship, and the M11 and the M12 enable that the M6 and the M8 are turned on alternatively through the complementary relationship of the PD(n−1) and the PU(n−1). In this case, a low level VGL is transmitted to the PD through the M6, ensuring that a potential of the PD becomes a low level before a potential of the PU becomes a high level, that is, the potential of the PD maintains a low level during the initial stage S1, the input phase S2 and the output phase S3.

Referring to both FIG. 2 and FIG. 3, operating states of the shift register unit in each display period are described as follows.

At the initial stage S1, a potential of the upper-stage pull-up node PU(n−1) is a high level, and the M12 is turned on and controls a potential of the upper-stage pull-up node PU(n−1) to be transmitted to the control node Ctrl, such that a potential of the control node Ctrl is a high level. A potential of the upper-stage pull-down node PD(n−1) is a low level, and the M11 is turned off to enable the control node Ctrl and the pull-up node PU to be disconnected. In such a manner, both the M6 and the M8 are turned on to control a potential of the PD to be a low level, the M10 is turned off, and the PU cannot discharge to the low level input terminal VGL through the M10, that is, the leakage path of the PU is turned off. At the initial phase S1, the potential of the PU is a low level. The M7 is turned on due to the high level of the upper-stage pull-up node PU(n−1), and controls the gate driving signal output terminal OUTPUT and the low level input terminal for inputting a low level VGL to be connected, such that an output of the OUTPUT is a low level, and performs noise release on the gate drive signal output terminal OUTPUT.

At the input stage S2, the CLK inputs a low level, the INPUT inputs a high level, the potential of the upper stage pull-up node PU(n−1) is a high level, and the potential of the upper stage pull-down node PD(n−1) is a low level. The input terminal INPUT inputs a high level, the M1 is turned on, and the potential of the PU is pulled to be a high level. M12 is turned on and controls the potential of the upper-stage pull-up node PU(n−1) to be transmitted to the control node Ctrl, such that the potential of the control node Ctrl is a high level. Both the M6 and the M8 are turned on due to the high level of the control node Ctrl, such that the potential of the pull-down node PD is controlled to be a low level, thus the leakage path M10 of the PU is controlled to be turned off. Since the leakage path M10 of the PU is turned off, the pull-up node PU can be quickly charged to a high level VGH. The M11 is turned off to enable the control node Ctrl and the pull-up node PU to be disconnected. The M7 is turned on, and the gate driving signal output terminal OUTPUT and the low level input terminal for inputting a low level VGL are controlled to be connected, such that an output of the OUTPUT is a low level, and denoising is performed on the gate drive signal output terminal OUTPUT. At the input phase S2, since the potential of the PU is a high level, the M3 is turned on.

At the output stage S3, the CLK inputs a high level, the potential of the pull-up node PU is a high level, the potential of the upper-stage pull-up node PU(n−1) is a low level, and the potential of the upper-stage pull-down node PD(n−1) is a high level. The M12 is turned off, thus the connection between the control node Ctrl and the upper-stage pull-up node PU (n−1) is disconnected. The M11 is turned on to enable the control node Ctrl and the pull-up node PU to be connected, such that the potential of the control node Ctrl is a high level. Both the M6 and the M8 are turned on due to the high level of the control node Ctrl, and control the potential of the pull-down node PD to be a low level, and thus controls the leakage path M10 of the PU to be turned off. In such a manner, the potential of the PU reaches a potential at which the output transistor M3 is fully turned on, and thus the output transistor M3 is fully turned on, and an output of the OUTPUT is a high level. The M7 is turned off and disconnects the connection between the gate drive signal output terminal OUTPUT and the low level input terminal for inputting a low level VGL. At the output stage S3, the INPUT outputs a low level, the M1 is turned off, the CLK inputs a high level, and the M3 enables the potential of the PU to be twice of the VGH through the charging of the storage capacitor C1. Both the M4 and the M10 are turned off due to the low level of the PD.

At the reset phase S4, the RESET outputs a high level, and the M2 is turned on, such that the potential of the pull-up node PU is a low level. The potential of the upper-stage pull-up node PU(n−1) is a low level, the potential of the upper-stage pull-down node PD(n−1) is a high level, M12 is turned off to enable a connection between the control node Ctrl and the upper-stage pull-up node PU(n−1) to be disconnected, and the M11 is turned on to control the control node Ctrl and the pull-up node PU to be conducted, such that the potential of the control node Ctrl is a low level. Both the M6 and the M8 are turned off due to the low level of the Ctrl, to control the potential of the pull-down node PD to be a high level, and the M4 is turned on to control the OUTPUT to output a low level. The M7 is turned off and disconnects the connection between the gate drive signal output terminal OUTPUT and the low level input terminal for inputting a low level VGL. At the reset phase S4, both the M4 and the M10 are turned on, and denoising is performed on the PU and the OUTPUT.

The embodiments of the present disclosure further discloses a shift register circuitry, including a plurality of cascaded shift register units mentioned above; and excepting a first stage of shift register unit, a first potential regulating circuit included in each stage of the shift register units is connected to an upper-stage pull-up node, and a second potential regulating circuit included in each stage of the shift register units is connected to an upper-stage pull-down node.

In a specific implementation, a first potential regulating circuit of the first stage of shift register unit is connected to an initial pull-up terminal, and a second potential regulating circuit of the first stage of shift register unit is connected to an initial pull-down terminal.

When a potential of the pull-up node in the first-stage shift register unit is equal to a potential of the PU as shown in FIG. 2, and a potential of the pull-down node in the first-stage shift register unit is equal to a potential of the PD as shown in FIG. 2, a potential of the initial pull-up terminal is equal to a potential of the PU(n−1) as shown in FIG. 2, and the potential of the initial pull-down terminal is equal to a potential of PD(n−1) as shown in FIG. 2.

Each stage of the shift register units may include an input terminal, a reset terminal, and a gate drive signal output terminal. Excepting the first stage of shift register unit, an input terminal of each stage of the shift register units is connected to a gate drive signal output terminal of an upper-stage shift register unit adjacent to the shift register unit; and excepting the last stage of shift register unit, a reset terminal of each stage of the shift register units is connected to a gate drive signal output terminal of a next stage of shift register unit adjacent to the shift register unit.

In an actual operation, an input terminal of the first stage of shift register unit is connected to the initial signal input terminal, and a reset terminal of the last stage of shift register unit is connected to a reset signal input terminal.

In a specific implementation, a gate driving signal outputted by the first stage shift register unit may be delayed by one display period than an initial signal inputted by the initial signal input terminal, and the reset signal inputted by the reset signal inputted terminal may be delayed by one display period than a gate drive signal outputted by the last stage shift register unit. The display period is equal to time spending on displaying one frame picture/N, where N is a positive integer, and N is equal to the number of stages of the shift register units included in the shift register circuitry.

Embodiments of the present disclosure further provide a display device including the shift register circuitry described above.

The display device according to the embodiments of the present disclosure may be any product or component having a display function, such as a mobile phone, a tablet computer, a television, a display, a notebook computer, a digital photo frame, a navigator, and the like.

The embodiments described above are optional embodiments of the present disclosure. It should be noted that, various improvements and polishment can be made by those ordinary skilled in the art without departing from the principle of the present disclosure, and those improvements and polishment fall within the protection scope of the present disclosure.

What is claimed is:

1. A shift register unit, applied to a shift register circuitry, wherein the shift register unit comprises:
   a pull-down node control circuit, connected to a control node and a pull-down node, and configured to control a change in a potential of the pull-down node according to a potential of the control node, wherein the potential of the control node and the potential of the pull-down node are inversed in phase; and
   a first potential regulating circuit, connected to an upper-stage pull-up node and the control node, and configured to: transmit a potential of the upper-stage pull-up node to the control node when the potential of the upper-stage pull-up node is an effective operating potential; and disconnect a connection between the control node and the upper-stage pull-up node when the potential of the upper-stage pull-up node is not an effective operating potential;
   wherein the upper-stage pull-up node is a pull-up node in an upper-stage shift register unit adjacent to the shift register unit in the shift register circuitry, and an upper-stage pull-down node is a pull-down node in an upper-stage shift register unit adjacent to the shift register unit in the shift register circuitry.

2. The shift register unit according to claim 1, further comprising:
   a second potential regulating circuit, connected between a pull-up node of the shift register unit and the control node, configured to enable the control node to be connected to the pull-up node when a potential of the upper-stage pull-down node is an effective operating potential, and disconnect a connection between the control node and the pull-up node when the potential of the upper-stage pull-down node is not an effective operating potential.

3. The shift register unit according to claim 2, wherein the first potential regulating circuit comprises a first potential regulating transistor, wherein both a gate electrode and a first electrode of the first potential regulating transistor are connected to the upper-stage pull-up node, and a second electrode of the first potential regulating transistor is connected to the control node.

4. The shift register unit according to claim 3, wherein the second potential regulating circuit comprises a second potential regulating transistor, wherein a gate electrode of the second potential regulating transistor is connected to the upper-stage pull-down node, a first electrode of the second potential regulating transistor is connected to the pull-up node, and a second electrode of the second potential regulating transistor is connected to the control node.

5. The shift register unit according to claim 4, wherein a potential change of the upper-stage pull-down node is in a complementary relation with a potential change of the upper-stage pull-up node, and the first potential regulating transistor and the second potential regulating transistor are turned on alternatively, such that the control node is at an effective operating potential during an initial phase, an input phase, and an output phase of each display period of the shift register unit.

6. The shift register unit according to claim 4, further comprising an output noise reduction circuit, connected to the upper-stage pull-up node, a gate drive signal output terminal, and a first level input terminal, wherein the output noise reduction circuit is configured to: enable the gate drive signal output terminal to be connected to the first level input terminal when a potential of the upper-stage pull-up node is an effective operating potential; and
disconnect a connection between the gate drive signal output terminal and the first level input terminal when the potential of the upper-stage pull-up node is not an effective operating potential.

7. The shift register unit according to claim 6, wherein the output noise reduction circuit comprises an output noise reduction transistor, wherein a gate electrode of the output noise reduction transistor is connected to the upper-stage pull-up node, a first electrode of the output noise reduction transistor is connected to the gate drive signal output terminal, and a second electrode of the output noise reduction transistor is connected to the first level input terminal,
wherein the output noise reduction transistor is configured to perform denoising on the gate drive signal output terminal.

8. The shift register unit according to claim 6, wherein the pull-down node control circuit comprises:
a first pull-down node control transistor, wherein both a gate electrode and a first electrode of the first pull-down node control transistor are connected to a second level input terminal;
a second pull-down node control transistor, wherein a gate electrode of the second pull-down node control transistor is connected to the control node, and a first electrode of the second pull-down node control transistor is connected to a second electrode of the first pull-down node control transistor;
a third pull-down node control transistor, wherein a gate electrode of the third pull-down node control transistor is connected to the second electrode of the first pull-down node control transistor, a first electrode of the third pull-down node control transistor is connected to the second level input terminal, and a second electrode of the third pull-down node control transistor is connected to the pull-down node; and
a fourth pull-down node control transistor, wherein a gate electrode of the fourth pull-down node control transistor is connected to the control node, a first electrode of the fourth pull-down node control transistor is connected to the pull-down node, and a second electrode of the fourth pull-down node control transistor is connected to the first level input terminal,
wherein a width-to-length ratio of the second pull-down node control transistor is greater than a width-to-length ratio of the first pull-down node control transistor, and a width-to-length ratio of the fourth pull-down node control transistor is greater than a width-to-length ratio of the third pull-down node control transistor,
wherein when each transistor is an n-type transistor, the effective operating potential is a high level, the first level input terminal inputs a low level, and the second level input terminal inputs a high level; and when each transistor is a p-type transistor, the effective operating potential is a low level, the first level input terminal inputs a high level, and the second level input terminal inputs a low level.

9. The shift register unit according to claim 6, further comprising:
a first pull-down circuit, connected to the pull-up node, the pull-down node and the first level input terminal, wherein the first pull-down circuit is configured to control the pull-up node and the first level input terminal to be connected or disconnected according to the potential of the pull-down node; and
an output circuit, connected to the pull-up node, a clock signal input terminal and a gate drive signal output terminal, wherein the output circuit is configured to control the gate drive signal output terminal and the clock signal input terminal to be connected or disconnected according to a potential of the pull-up node.

10. The shift register unit according to claim 9, wherein the first pull-down circuit comprises a first pull-down transistor, a gate electrode of the first pull-down transistor is connected to the pull-down node, a first electrode of the first pull-down transistor is connected to the pull-up node, and a second electrode of the first pull-down transistor is connected to the first level input terminal;
wherein the output circuit comprises:
an output transistor, wherein a gate electrode of the output transistor is connected to the pull-up node, a first electrode of the output transistor is connected to the clock signal input terminal, and a second electrode of the output transistor is connected to the gate drive signal output terminal; and
a storage capacitor, wherein a first end of the storage capacitor is connected to the pull-up node, and a second end of the storage capacitor is connected to the gate drive signal output terminal.

11. The shift register unit according to claim 10, wherein each transistor of the shift register unit is an n-type transistor, and each display period of the shift register unit comprises an initial phase, an input phase, an output phase and a reset phase,
wherein at the initial phase, the potential of the upper-stage pull-up node is a high level, the first potential regulating transistor is turned on and transmits the high level of the upper-stage pull-up node to the control node, such that the potential of the control node is a high level; the potential of the upper-stage pull-down node is a low level, and the second potential regulating transistor is turned off, such that a connection between the control node and the pull-up node is disconnected, the fourth pull-down node control transistor and the second pull-down node control transistor are turned on under the action of the high level of the control node; the potential of the pull-down node is a low level, the first pull-down transistor is turned off to prohibit the pull-up node from discharging to the first level input terminal through the first pull-down transistor.

12. The shift register unit according to claim 11, wherein, at the input phase, the pull-up node is rapidly charged to a second level through a high level inputted by an input circuit, the potential of the upper-stage pull-up node is a high level, the potential of the upper-stage pull-down node is a low level, and the first pull-down transistor is turned off to prohibit the pull-up node from discharging to the first level inputted through the first pull-down transistor.

13. The shift register unit according to claim 12, wherein, at the output phase, the clock signal input terminal inputs a high level, and a storage capacitor is charged to pull up the potential of the pull-up node to be twice of the second level.

14. A shift register circuitry, comprising a plurality of cascaded shift register units;

wherein each of the plurality of shift register units comprises:

a pull-down node control circuit, connected to a control node and a pull-down node, and configured to control a change in a potential of the pull-down node according to a potential of the control node, wherein the potential of the control node and the potential of the pull-down node are inversed in phase; and a first potential regulating circuit, connected to an upper-stage pull-up node and the control node, and configured to: transmit a potential of the upper-stage pull-up node to the control node when the potential of the upper-stage pull-up node is an effective operating potential; and disconnect a connection between the control node and the upper-stage pull-up node when the potential of the upper-stage pull-up node is not an effective operating potential;

wherein the upper-stage pull-up node is a pull-up node in an upper-stage shift register unit adjacent to the shift register unit in the shift register circuitry, and an upper-stage pull-down node is a pull-down node in an upper-stage shift register unit adjacent to the shift register unit in the shift register circuitry, excepting a first stage of shift register unit, the first potential regulating circuit included in each stage of the shift register units is connected to the upper-stage pull-up node, and a second potential regulating circuit included in each stage of the shift register units is connected to the upper-stage pull-down node.

15. The shift register circuitry according to claim 14, wherein each of the plurality of shift register units further comprises: the second potential regulating circuit, connected between a pull-up node of the shift register unit and the control node, configured to enable the control node to be connected to the pull-up node when a potential of the upper-stage pull-down node is an effective operating potential, and disconnect a connection between the control node and the pull-up node when the potential of the upper-stage pull-down node is not an effective operating potential.

16. The shift register circuitry according to claim 14, wherein the first potential regulating circuit comprises a first potential regulating transistor, wherein both a gate electrode and a first electrode of the first potential regulating transistor are connected to the upper-stage pull-up node, and a second electrode of the first potential regulating transistor is connected to the control node, the second potential regulating circuit comprises a second potential regulating transistor, wherein a gate electrode of the second potential regulating transistor is connected to the upper-stage pull-down node, a first electrode of the second potential regulating transistor is connected to the pull-up node, and a second electrode of the second potential regulating transistor is connected to the control node.

17. A display device, comprising the shift register circuitry according to claim 14.

* * * * *